US010453891B2

United States Patent
Tomizawa et al.

(10) Patent No.: US 10,453,891 B2
(45) Date of Patent: Oct. 22, 2019

(54) SUBSTRATE WITH CONDUCTIVE FILM

(71) Applicant: AGC Inc., Chiyoda-ku (JP)

(72) Inventors: Takeshi Tomizawa, Chiyoda-ku (JP); Yuki Aoshima, Chiyoda-ku (JP); Reo Usui, Chiyoda-ku (JP); Hidefumi Odaka, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 2 days.

(21) Appl. No.: 15/666,038

(22) Filed: Aug. 1, 2017

(65) Prior Publication Data

US 2017/0330913 A1 Nov. 16, 2017

Related U.S. Application Data

(63) Continuation of application No. PCT/JP2016/052504, filed on Jan. 28, 2016.

(30) Foreign Application Priority Data

Feb. 4, 2015 (JP) ................... 2015-020414

(51) Int. Cl.
*H01L 27/146* (2006.01)
*B32B 7/02* (2019.01)
(Continued)

(52) U.S. Cl.
CPC .......... *H01L 27/14696* (2013.01); *B32B 7/02* (2013.01); *B32B 9/00* (2013.01);
(Continued)

(58) Field of Classification Search
CPC ........... G06F 3/044; G06F 2203/04103; G06F 2203/04112; C23C 14/5806
See application file for complete search history.

(56) References Cited

U.S. PATENT DOCUMENTS

2011/0111215 A1* 5/2011 Yamada .............. C23C 18/1216
   428/336
2011/0293888 A1* 12/2011 Stowers ................ G03F 7/0042
   428/141
(Continued)

FOREIGN PATENT DOCUMENTS

EP    2 450 467 A1    5/2012
JP    61-190815    8/1986
(Continued)

OTHER PUBLICATIONS

H.Askari, H. Fallah, M. Askari, and M.C. Mohmmadieyh, "Electrical and optical properties of ITO thin films prepared by DC magnetron sputtering for low-emitting coatings," eprint arXiv:1409. 5293 (2014) (Year: 2014).*

(Continued)

*Primary Examiner* — Charles D Garber
*Assistant Examiner* — Xiaoming Liu
(74) *Attorney, Agent, or Firm* — Oblon, McClelland, Maier & Neustadt, L.L.P.

(57) ABSTRACT

A substrate with conductive film includes a base material; and a film of a conductive metal oxide arranged on an upper part of the base material. The film includes, by a top plan view, a first region and a second region, the second region is configured of a same material as the first region, and an electric resistance of the second region is higher than an electric resistance of the first region. The second region includes a part configured by a plurality of cellular sections surrounded by a plurality of fine cracks. In the part, each fine crack has a width of 1 nm to 50 nm, and each cellular section has a largest measure of less than 10 μm.

15 Claims, 6 Drawing Sheets

(51) Int. Cl.
  *B32B 9/00* (2006.01)
  *H01B 5/14* (2006.01)
  *H05K 1/02* (2006.01)
  *H01L 51/00* (2006.01)
  *C01G 9/02* (2006.01)
  *C01G 15/00* (2006.01)
  *C01G 19/02* (2006.01)
  *C08F 14/26* (2006.01)
  *C08G 63/183* (2006.01)
  *C08G 64/02* (2006.01)

(52) U.S. Cl.
  CPC .......... *H01B 5/14* (2013.01); *H01L 51/0021* (2013.01); *H05K 1/02* (2013.01); *C01G 9/02* (2013.01); *C01G 15/00* (2013.01); *C01G 19/02* (2013.01); *C08F 14/26* (2013.01); *C08G 63/183* (2013.01); *C08G 64/02* (2013.01); *H01L 2251/306* (2013.01)

(56) References Cited

U.S. PATENT DOCUMENTS

2012/0114923 A1    5/2012  Haishi et al.
2014/0035193 A1    2/2014  Haishi et al.
2014/0036171 A1    2/2014  Haishi et al.
2014/0338960 A1*  11/2014  Inoue .................. B32B 7/02
                                                    174/253
2015/0263233 A1    9/2015  Miyoshi et al.
2016/0325457 A1*  11/2016  West .................... B26F 3/00

FOREIGN PATENT DOCUMENTS

JP       2012-114070       6/2012
JP        2014-60293       4/2014
JP       2014-201746      10/2014
JP       2014-209333      11/2014
WO    WO 2013/111806 A1   8/2013

OTHER PUBLICATIONS

International Search Report dated Apr. 12, 2016 in PCT/JP2016/052504, filed on Jan. 28, 2016 (with English translation).

Written Opinion dated Apr. 12, 2016 in PCT/JP2016/052504, filed on Jan. 28, 2016.

* cited by examiner

SUBSTRATE WITH CONDUCTIVE FILM

CROSS-REFERENCE TO RELATED APPLICATION

The present application is a continuation application filed under 35 U.S.C. 111(a) claiming benefit under 35 U.S.C. 120 and 365(c) of PCT International Application No. PCT/JP2016/052504 filed on Jan. 28, 2016 and designating the U.S., which claims priority of Japanese Patent Application No. 2015-020414 filed on Feb. 4, 2015. The entire contents of the foregoing applications are incorporated herein by reference.

BACKGROUND OF THE INVENTION

1. Field of the Invention

The disclosure herein generally relates to a substrate with conductive film.

2. Description of the Related Art

Substrates with conductive films configured by arranging conductive metal oxide films on base materials have been applied to various fields such as display devices and electrochromic devices.

Typically, in the substrate with conductive film, the conductive metal oxide film is formed "in a pattern shape" on the base material. That is, on the base material, there exists a region in which a conductive metal oxide film is present and a region in which the conductive metal oxide film is absent. There is a case in which empty space exists in the region in which the conductive metal oxide film is absent (in this case, the pattern is a projecting and recessed pattern), and a case in which a non-conductive filling material is arranged.

In such a substrate with a conductive film having the conductive metal oxide film arranged "in a pattern shape", according to an effect of a difference in refractive indices between the base material and the conductive metal oxide film, or the like, such a film pattern is often viewed from outside (in the following, referred to as "a skeleton-visible phenomenon"). Thus, there is a problem that in an apparatus provided with a substrate with a conductive film, when such a skeleton-visible phenomenon occurs, an appearance of the apparatus becomes worse, and beauty of the apparatus is lost.

Thus, various countermeasures have been proposed in order to suppress the occurrence of the skeleton visible phenomenon, in the substrate with conductive film (See Japanese Unexamined Patent Application Publication No. 2014-209333, and Japanese Unexamined Patent Application Publication No. 2014-201746).

For example, Japanese Unexamined Patent Application Publication No. 2014-209333 discloses arranging an index matching layer between the transparent substrate and a transparent electrode layer, and thereby causing the pattern of the transparent electrode layer not readily to be viewed.

Moreover, Japanese Unexamined Patent Application Publication No. 2014-201746 discloses arranging a refraction index adjusting layer between a transparent conductive film and a transparent base material.

SUMMARY OF THE INVENTION

As described above, in a substrate with conductive film, in order to prevent a skeleton-visible phenomenon from occurring, various countermeasures have been proposed.

However, in the conventional countermeasures, a new layer in which a refraction index is controlled with high precision is required to be added, and there is a problem that the manufacturing process becomes complicated. Therefore, a technique that can eliminate a skeleton-visible phenomenon by a simpler method is desired.

The present invention was made in view of such a problem, and it is an object of the present invention to provide a substrate with conductive film that can eliminate a skeleton-visible phenomenon by a simpler method.

In the present invention, a substrate with conductive film including:

a base material; and a film of a conductive metal oxide arranged on an upper part of the base material, the film including, by a top plan view, a first region and a second region, the second region being configured of a same material as the first region, and an electric resistance of the second region being higher than an electric resistance of the first region, the second region including a part configured by a plurality of cellular sections surrounded by a plurality of fine cracks, and in the part, each fine crack having a width of 1 nm to 50 nm, and each cellular section having a largest measure of less than 10 µm, is provided.

The present invention can provide a substrate with conductive layer that can eliminate or reduce a skeleton visible phenomenon by a simpler method.

BRIEF DESCRIPTION OF THE DRAWINGS

Other objects and further features of embodiments will become apparent from the following detailed description when read in conjunction with the accompanying drawings, in which.

DETAILED DESCRIPTION OF THE PREFERRED EMBODIMENTS

Figure 1:
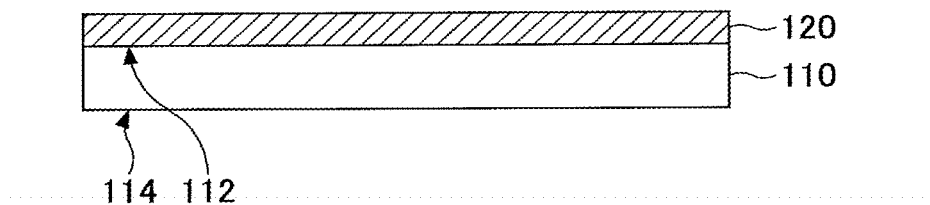
FIG. 1 is a cross-sectional diagram schematically depicting a configuration of a substrate with conductive film according to an embodiment of the present invention.

In the following, with reference to drawings, embodiments of the present invention will be described specifically.

(Substrate with Conductive Film According to the Present Invention)

In the present invention, a substrate with conductive film including a base material; and a film of a conductive metal oxide arranged on an upper part of the base material, the film including, by a top plan view, a first region and a second region, the second region being configured of a same material as the first region, with a higher electric resistance than the first region, the second region including a part configured by a plurality of cellular sections surrounded by a plurality of fine cracks, and in the part, each fine crack having width of 1 nm to 50 nm, and each cellular region having a largest measure of less than 10 μm, is provided.

As described above, in the conventional substrate with conductive film, according to an effect of a difference in refractive indices between the base material and the conductive metal oxide film, of the like, it is often found that a pattern of the conductive metal oxide film is viewed from outside. Thus, there is a problem that in an apparatus provided with a substrate with conductive film, when such a skeleton-visible phenomenon occurs, an appearance of the apparatus becomes worse, and beauty of the apparatus is lost.

The substrate with conductive film according to the present invention has a feature that a film of a conductive metal oxide is not arranged on a base material in the conventional "pattern shape". That is, in the substrate with conductive film according to the present invention, instead of the conventional configuration in which a region including a film of a conductive metal oxide and a region not including a film of a conductive metal oxide are formed and arranged on the base material, a film of a conductive metal oxide is arranged on the base material over a required region in an aspect where the film of a conductive metal oxide is present "continuously".

In this case, by a top plan view, because in a part where the film of a conductive metal oxide is formed, regions having appreciably differing refractive indices are not present, the above-described problem of a skeleton-visible phenomenon is significantly eliminated or reduced.

In the substrate with conductive material according to the present invention, in order to enable such a "continuous" arrangement of a film of a conductive metal oxide, a first region and a second region of the film of a conductive metal oxide are arranged on the base material. Although the second region is configured of substantially the same material as the first region, the second region has a feature that an electric resistance is higher than the first region.

In the substrate with conductive film according to the present invention, in order to express such a difference in electric resistance between the first region and the second region, the second region is formed so that (i) a part configured by a plurality of cellular section surrounded by a plurality of fine cracks is present, and (ii) in the part, each fine crack has a width of 1 nm to 50 nm, and each cellular section has a largest measure of less than 10 μm.

In the second region including the above-described characteristic part (in the following, referred to as a "fine structure part"), according to the plurality of fine cracks, the electric resistance can be significantly increased, compared with the case where such a fine crack is not present (first region).

In the present application, the "fine crack" represents a crack that is difficult to be recognized to the naked eye.

According to the above-described characteristic configuration, in the substrate with conductive film according to the present invention, the problem in the related art of a skeleton-visible phenomenon can be significantly eliminated or reduced.

Moreover, in the present invention, it is not necessary to newly arrange layers such as an index matching layer and a refractive index adjusting layer, in order to obtain such an effect. The problem of a skeleton-visible phenomenon can be handled with a simpler configuration. Therefore, a substrate with conductive film can be provided by a relatively simple manufacturing process.

In the following description, the arrangement mode of the first region and the second region of the film of a conductive metal oxide formed on the substrate with conductive film according to the present invention will be referred also to as a "pattern". However, it must be noted that this "pattern" means a "design" configured by the first region and the second region in the continuous film, and does not mean a conventional pattern by existent parts/non-existent parts of a film of a conductive metal oxide.

(Substrate with Conductive Film According to Embodiment of Present Invention)

Next, with reference to FIG. 1 and FIG. 2, a substrate with conductive film according to an embodiment of the present invention will be described. FIG. 1 schematically depicts a configuration of a cross section of the substrate with conductive film according to the embodiment of the present invention (in the following, referred to as a "first substrate with conductive film"). Moreover, FIG. 2 schematically depicts a top view of the first substrate with conductive film, illustrated in FIG. 1.

As illustrated in FIG. 1, the first substrate with conductive film 100 includes a base material 110 having a first surface 112 and a second surface 114; and a film of a conductive metal oxide 120 (in the following, referred to as a "conductive film") arranged on the first surface 112 of the base material 110.

Figure 2:
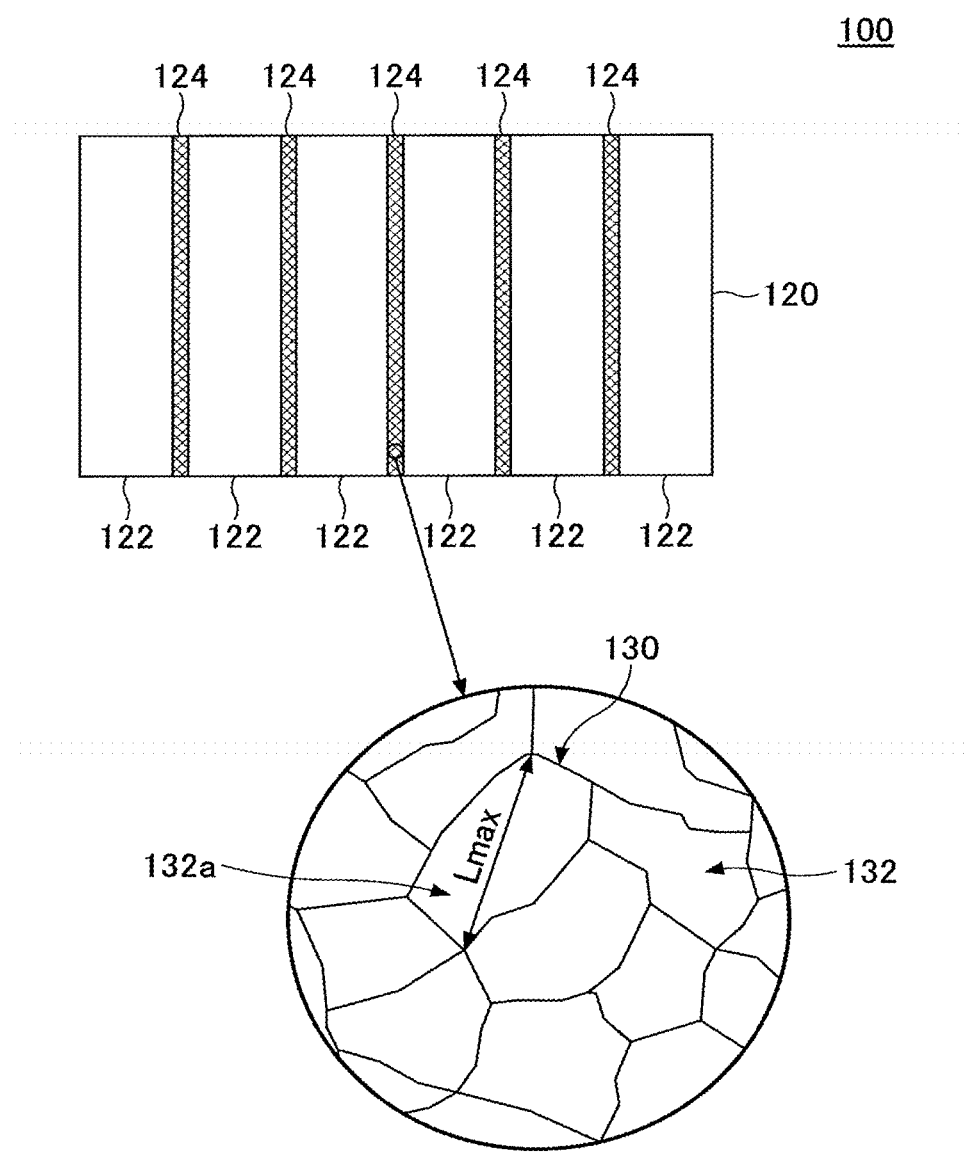
FIG. 2 is a diagram schematically depicting a state of a surface of the substrate with conductive film illustrated in FIG. 1.

As illustrated in FIG. 2, in the first substrate with conductive film 100, the conductive film 120 is, by a top plan view, configured as a pattern having a first region 122 and a second region 124. However, because any region of the first region 122 and the second region 124 is extremely small, an interface between the region 122 and the region 124 typically cannot be recognized to the naked eye. That is, FIG. 2 illustrates exaggeratingly the interface between the respective regions 122, 124 for the clarification of the description.

In the example illustrated in FIG. 2, the conductive film 120 has, by the top plan view, a configuration in which the second regions 124 are arranged as fine line patterns among the first regions 122. A width of each of the second regions 124 falls within a range of 5 μm to 150 μm, for example.

However, the above-described configuration is an example. The first region 122 and the second region 124 may be arranged so as to configure any patterns. For example, the conductive film 120 may have a configuration, by the top plan view, in which the first regions 122 are arranged as fine line patterns among the second regions 124. Alternatively, the conductive film 120 may have a lattice-shape pattern of the first region 122 or the second region 124. Alternatively, the conductive film 120 may have a pattern in which the second region 124 is arranged in the first region 122 as an island shape (dotted shape), or may have such a pattern inverted.

In the conductive film 120, the first region 122 and the second region 124 are formed of substantially the same material.

The second region 124 has a feature of having a fine structure part. That is, the second region 124 has, as illustrated in an enlarged diagram in a circular frame in FIG. 2, by the top plan view, a part configured by a plurality of cellular sections 132 surrounded by a plurality of fine cracks 130.

A width of the fine crack 130 falls within a range of 1 nm to 50 nm, and preferably falls within a range of 5 nm to 30 nm. Moreover, the largest measure $L_{max}$ of the cellular section 132 is less than 10 µm, and preferably falls within a range of 1 µm to 7 µm.

The largest measure $L_{max}$ of the cellular sections 132 is defined as the greatest measure of the cellular sections 132. For example, as the cellular section 132a illustrated in FIG. 2, when the cellular section has an approximate polygonal shape (for example, an approximate rectangle, an approximate trapezoid, or an approximate parallelogram), the largest measure $L_{max}$ is defined as a length of a diagonal line that has the greatest length. Moreover, when the cellular section 132 is an approximate circular shape or an approximate elliptic shape, the largest measure $L_{max}$ is defined as a length of a diameter or a long axis.

In the configuration of the above-described second region 124, when an electric current flows in the second region 124, according to the presence of numerous fine cracks 130, a smooth flow of the electric current is interrupted. Thus, the electric current does not readily flow by the shortest distance, and a path of the electric current becomes substantially greater as compared to apparent dimensions. As a result, even when the first region 122 and the second region 124 are configured of substantially the same material, the electric resistance in the second region 124 is substantially greater than in the first region 122.

Therefore, in the first substrate with conductive film 100, the second region 124 of the conductive film 120 can be used as a "high resistance region" in which an electric current does not readily flow.

Moreover, according to the above-described configuration, in the first substrate with conductive film 100, a state such as in a conventional pattern with existent parts/nonexistent parts of a film of a conductive metal oxide being formed on the base material can be reproduced. For example, in the example illustrated in FIG. 2, the part that is the first region 122 in the conductive film 120 functions as the existent part of the film of a conventional conductive metal oxide.

In the above-described first substrate with conductive film 100, a "difference in level" such as a conventional recessed and projecting pattern does not exist in the conductive film 120. Moreover, in the surface of the conductive film 120, regions with substantially differing refractive indices do not exist. Therefore, in the first substrate with conductive film 100, the conventional problem of a skeleton-visible phenomenon can be significantly eliminated or reduced.

Furthermore, in the first substrate with conductive film 100, as a countermeasure for the problem of a skeleton visible phenomenon, new layers such as an index matching layer and a refractive index adjusting layer need not be arranged. The problem of a skeleton-visible phenomenon can be managed with a simpler configuration. Therefore, a substrate with conductive film can be provided by a relatively simple manufacturing process.

Figure 3:
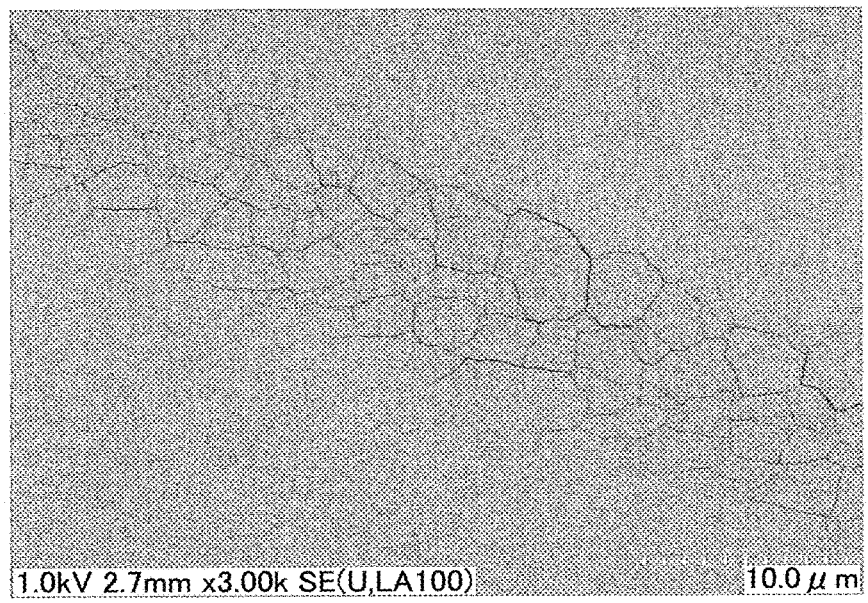
FIG. 3 is a diagram depicting an example of a film of a conductive metal oxide including a first region and a second region (SEM photograph)

FIG. 3 depicts a film of a conductive metal oxide having the first region and the second region according to the embodiment (SEM photograph). In FIG. 3, it is found that the second region having fine structure parts in line shapes are formed over a width of about 8 µm between the two first regions.

(Each Configuration Member)

Next, for the first substrate with conductive film 100 illustrated in FIG. 1 and FIG. 2, as an example, a specification of each member configuring the substrate with conductive film will be described in more detail.

(Base Material 110)

The base material 110 may be configured of any material.

For example, the base material 110 may be a transparent base material configured of a transparent material. Such a material for transparent base material includes, for example, a glass, a resin, or a plastic.

The glass for transparent base material includes, for example, a soda lime glass, a borosilicate glass, an aluminosilicate glass, a quartz glass, and an alkali-free glass.

The plastic for transparent base material includes, for example, a polyethylene terephthalate (PET), a polytetrafluoroethylene (PTFE), and a polycarbonate.

Moreover, the base material 110 does not necessarily have to be configured by a single member. For example, the base material 110 may be configured by a plurality of layers. For example, when a glass including alkali metal is used for a base material, in order to prevent alkali metal from diffusing from the glass side, a barrier film is often arranged on a surface of the glass. Therefore, also in the present application, when applying a glass including alkali metal to the base material 110, a barrier film such as a silica may be arranged on the surface of the glass.

A thickness of the base material 110 is not particularly limited, but may fall within a range of 0.1 mm to 6 mm, for example.

(Conductive Film 120)

The conductive film 120 may be configured of any material as long as a metal oxide having conductivity is included.

For example, the conductive film 120 may be a transparent conductive film. Such a transparent conductive film includes, for example, a material including an oxide of at least one metal selected from a group including Indium (In), Tin (Sn), and Zinc (Zn). For example, the transparent conductive film may be an ITO (Indium Tin Oxide), an FTO (Fluorine Tin Oxide), a TTO (Tantalum-doped Tin Oxide), an AZO (Aluminum-doped Zinc Oxide), or a GZO (Gallium Zinc Oxide).

A thickness of the conductive film 120 is not particularly limited, but the conductive film 120 may have a thickness that falls within a range of 10 nm to 300 nm, for example.

The conductive film 120 is not necessarily required to be configured by a single layer, and may be configured as a laminated film of two or more layers.

As described above, the conductive film 120 includes the first region 122 and the second region 124. The second region 124, when the conductive film 120 is viewed from above, has a plurality of cellular sections 132 surrounded by a plurality of fine cracks 130. Moreover, because the second region 124 includes such a fine structure part, the second region has a greater electric resistance than the first region 122.

The fine cracks 130 included in the second region 124 has a width that falls within a range of 1 nm to 50 nm. A measure of the width preferably falls within a range of 5 nm to 30 nm. Moreover, the largest measure $L_{max}$ of the cellular section 132 surrounded by the fine cracks 130 is less than 10 μm, and is preferably within the range of 1 μm to 7 μm.

Moreover, in the conductive film 120, a height level of the uppermost surface of the first region 122 and a height level of the uppermost surface of the second region 124 are preferably within a range of ±30% with respect to the height of the uppermost surface of the first region 122. Especially, the uppermost surface of the first region 122 and the uppermost surface of the second region 124 are more preferably at substantially the same height level (within a range of ±20% with respect to the height of the uppermost surface of the first region 122). According to the above-described configuration, the conventional "a skeleton-visible" phenomenon can be further controlled against.

As described above, in the conductive film 120, an arrangement mode of the first region 122 and the second region 124 is not particularly limited. For example, in the conductive film 120, the second region 124 may be arranged, in addition to the line-shape pattern illustrated in FIG. 2, in a lattice shape pattern, or in a dot shape pattern. Alternatively, the first region 122 may be arranged inversely in the above-described pattern. Moreover, in the line shape pattern, the lattice shape pattern and the dot shape pattern, the width of the pattern may fall within a range of 5 μm to 150 μm, for example.

(Application Example of Substrate with Conductive Film According to Embodiment of Present Invention)

The substrate with conductive film according to the embodiment of the present invention having the above-described feature can be used for a display device, for example.

The display device includes, for example, a touch panel of an electrostatic capacitance type, such as a tablet type terminal. For example, in a tablet type PC equipped with a touch panel, according to the above-described characteristic configuration of the substrate with conductive film, the conventional problem of skeleton visible phenomenon can be significantly eliminated or reduced.

(Manufacturing Method of Substrate with Conductive Film According to Present Invention)

Next, with reference to FIG. 4, a manufacturing method of a substrate with conductive film according to the embodiment of the present invention will be described.

In the following description, for the first substrate with conductive film 100 having the above-described configuration illustrated in FIG. 1 and FIG. 2, as an example, a manufacturing method thereof will be explained. Therefore, upon explaining each member, the reference numerals indicated in FIG. 1 and FIG. 2 will be used. However, it is obvious to a person skilled in the art that the following explanation can also be applied similarly to a manufacturing method of a substrate with conductive film of another configuration.

Figure 4:
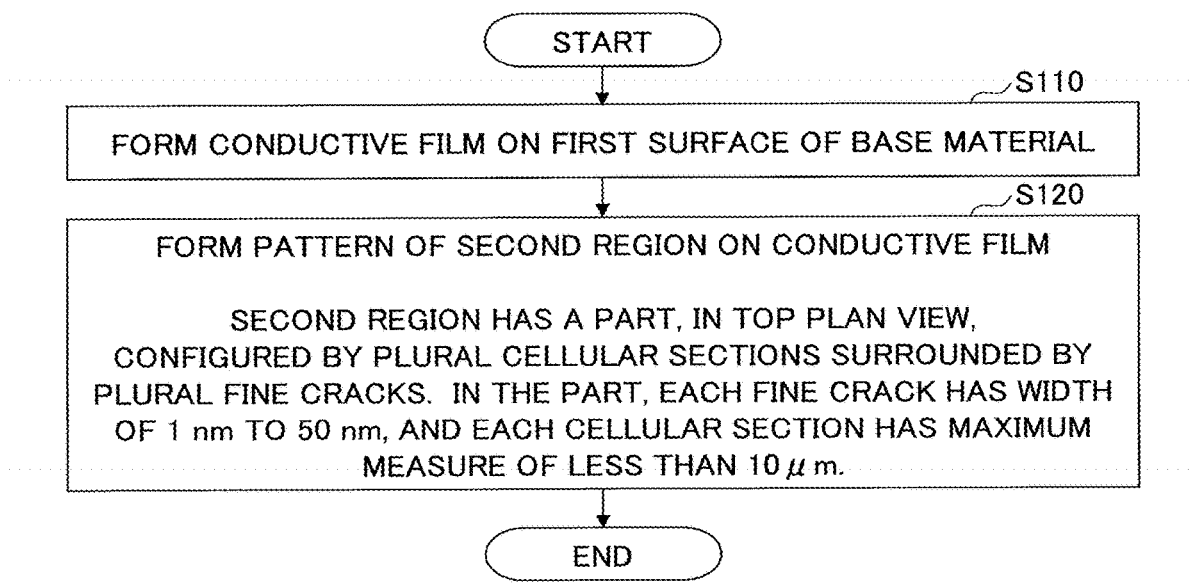
FIG. 4 is a flowchart schematically depicting a manufacturing method of the substrate with conductive film according to the embodiment.

FIG. 4 is a flowchart schematically depicting the manufacturing method of the substrate with conductive film according to the embodiment of the present invention (in the following, referred to as a "first manufacturing method").

As described in FIG. 4, the first manufacturing method includes:

a step of forming a conductive film on a first surface of a base material (step S110); and a step of forming a pattern of a second region on the conductive film, the second region, by a top plan view, including a part configured by a plurality of cellular sections surrounded by a plurality of fine cracks, in the part, each fine crack having a width of 1 nm to 50 nm, and each cellular section having a largest measure of less than 10 μm (step S120).

In the following, each step will be described.

(Step S110)

First, a base material 110 for a substrate with conductive film is prepared. As described above, for the base material, for example, a transparent base film such as a glass, a resin, or a plastic may be used. Moreover, the base material 110 may be configured by a plurality of members (layers).

Next, on one surface (first surface 112) of the base material 110, a conductive film 120 is formed.

The conductive film 120 may be configured by, as described above, a transparent conductive film such as an ITO.

Moreover, a method for forming the conductive film 120 is not particularly limited. The conductive film 120 may be deposited on the base material 110 by, for example, a sputtering method, an evaporation method, a PVD method, and the like.

The conductive film 120 may be configured by a plurality of layers. A thickness of the conductive film 120 falls within, for example, a range of 10 nm-300 nm.

(Step S120)

Next, a pattern of a second region 124 is formed on the conductive film 120 formed in Step S110.

The second region 124 has, as described above, by a top plan view, includes a part configured by a plurality of cellular sections surrounded by a plurality of fine cracks (i.e. fine structure part). Moreover, each fine crack 130 has a width of 1 nm-50 nm, and each cellular section 132 has a largest measure of less than 10 μm.

According to the presence of such a fine structure part, the second region 124 functions as a region with a greater electric resistance than the surroundings, i.e. a high resistance region.

The second region 124 having the above-described feature can be formed, for example, by the following method.

(Method of Forming Second Region 124)

(a) First, a part of the conductive film 120, in which the second region 124 will be formed, is irradiated with a laser light.

A type of the laser light is not particularly limited. For example, a gas laser, such as a $CO_2$ laser, and a solid state laser, such as a YAG laser may be used. The conductive film 120 may be irradiated with the laser light via a mask or the like, for example.

By the irradiation of the laser light, an irradiated region is heated locally, and a local change in volume (expansion) occurs. Moreover, according to the expansion, in the irradiated region, numerous fine cracks 130 are generated, and numerous cellular sections 132 surrounded by the fine cracks are formed.

As a result, in the irradiated region, the second region 124 having the fine structure part can be arranged.

It is necessary to be cautious against causing an energy inputted into the irradiated region of the conductive film 120 to become too great. This is because, in the case where the energy inputted into the irradiated region becomes too great according to an effect from selecting a laser light of high power or the like, for example, when the conductive film 120 is irradiated with the laser light, the conductive film 120 of the irradiated region may be removed (in such a case, the conventional pattern of the conductive film (conventional recessed and projecting pattern) may be formed).

Accordingly, the energy inputted into the irradiated region is selected from an appropriate range so as to form fine cracks 130 and cellular sections 132 on the irradiated region of the conductive film 120.

Via the above-described processes of steps S110 to S120, the substrate with first conductive film 100, in which the conductive film 120 has a pattern of the second region 124, can be manufactured.

As described above, with the first manufacturing method, as an example, a manufacturing method of a substrate with conductive film according to the embodiment of the present invention has been described. However, it is obvious to a person skilled in the art that the substrate with conductive layer according to the embodiment of the present invention may be manufactured by using another manufacturing method.

For example, in the above-described method, at step S120, the conductive film is irradiated with a laser light in order to form a fine structure part on the conductive film. However, instead of the laser light, a fine structure part may be formed on the conductive film by irradiating the conductive film with a flash lamp. Additionally, by various methods, a fine structure part can be formed on the conductive film.

PRACTICAL EXAMPLE

In the following, practical examples of the substrate with conductive film according to the present invention will be described.

Example 1

A substrate with conductive film was prepared by the following method.

First, for the base material, a transparent soda lime glass substrate with a thickness of 3.2 mm was prepared. On one surface of the glass substrate, an $SiO_2$ layer was previously arranged as a barrier layer. A thickness of the $SiO_2$ layer was about 20-30 nm.

Next, in a state where the glass substrate was heated at 300° C., an ITO layer was deposited on the glass substrate by a sputtering method. For a target, an ITO target containing $SnO_2$ of 10 wt % was used. A film thickness of the deposited ITO layer was 150 nm.

Next, a TTO layer was deposited on the ITO layer by a sputtering method. For a target, an $SnO_2$ target containing $Ta_2O_5$ of 5 wt % was used. A film thickness of the deposited TTO layer was 20 nm.

According to the above-described processes, a sample in which a conductive film of two-layered structure was arranged on the glass substrate with the $SiO_2$ layer (in the following, referred to as a "sample 1") was manufactured.

Next, a pattern of an irradiated region was formed on the conductive film of the sample 1, by the following method.

First, the sample 1 was arranged to be level such that the conductive film was in an upward direction.

Next, the conductive film of the sample 1 was irradiated with a laser light. For the laser light, a laser with a wavelength of 1064 nm was used. Moreover, a pulse energy of the laser light was set to 4 µJ.

The laser light scanned the conductive film linearly along a first direction. Next, an irradiation position of the laser light was shifted by 4 µm, and the laser light scanned along the first direction. The above-described operation was repeated a few times, and a linear-shaped irradiated region with a width of about 10 µm was formed. The same operation was repeated at the other locations of the conductive film, and a plurality of linear-shaped irradiated regions were formed on the conductive film.

The substrate with conductive film obtained by the above-described processes will be referred to, in the following, as a "substrate with conductive film according to the example 1". In the substrate with conductive film according to the example 1, the skeleton-visible phenomenon was not observed.

(Evaluation)

Next, by using the substrate with conductive film according to the example 1, various evaluations were performed as follows.

(Observation of Surface)

The surface of the conductive film of the substrate with conductive film according to the example 1 was observed by using a scanning electron microscope (FE-SEM SU-70: by Hitachi, Ltd.).

Figure 5:
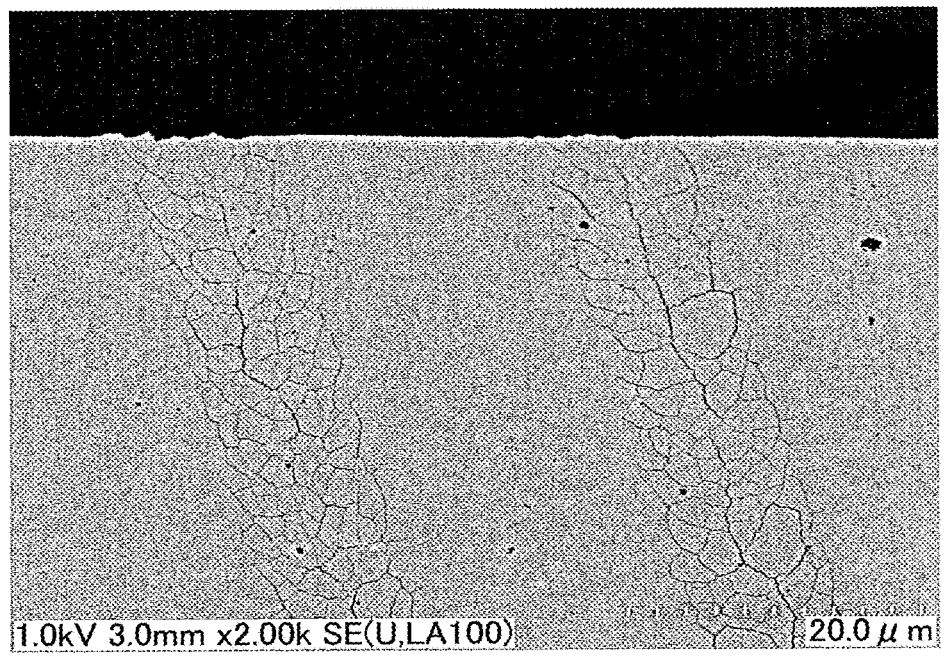
FIG. 5 is a photograph enlargedly depicting a surface of a part of a conductive film on the substrate with conductive film according to an Example 1 (SEM photograph)
Figure 6:
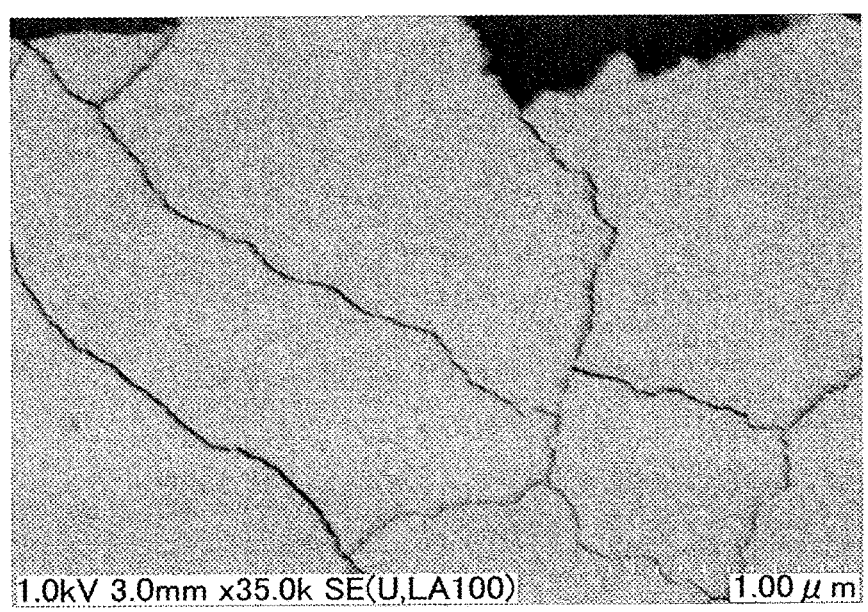
FIG. 6 is a photograph enlargedly depicting an irradiated region of the conductive film illustrated in FIG. 5 (SEM photograph)

FIGS. 5 and 6 depict examples of obtained results. FIG. 5 indicates a photograph enlargedly depicting a surface of a part of the conductive film of the substrate with conductive film according to the example 1. FIG. 6 indicates a photograph enlargedly depicting the irradiated region of the conductive film.

From these figures, it is found that in the irradiated region of the laser light of the conductive film a fine structure part exists. In the fine structure part, widths of fine cracks fall within a range of 1 nm to 50 nm in any locations. Moreover, largest measures $L_{max}$ of cellular sections fall within a range of 1 µm-7 µm.

In this way, it was confirmed that by irradiating with the laser light, in the irradiated region, a second region including the fine structure part was formed. That is, it was confirmed that in the conductive film of the substrate with conductive film according to the example 1, patterns of the first region (corresponding to a non-irradiated region of laser light) and the second region (corresponding to the irradiated region of laser light) were formed.

(Measurement of Surface Unevenness State)

Next, a surface unevenness state of the conductive film was measured. For the measurement, a stylus type step profiler (DEKTAK 150: by Veeco Instruments Inc.) was used. The measurement was performed over the first region and the second region of the conductive film.

Upon measuring, a stylus was caused to scan the conductive film so that the stylus crossed the second region vertically. That is, the measurement was performed along a direction approximately orthogonal to a direction of extension of the second region of the conductive film.

Figure 7:
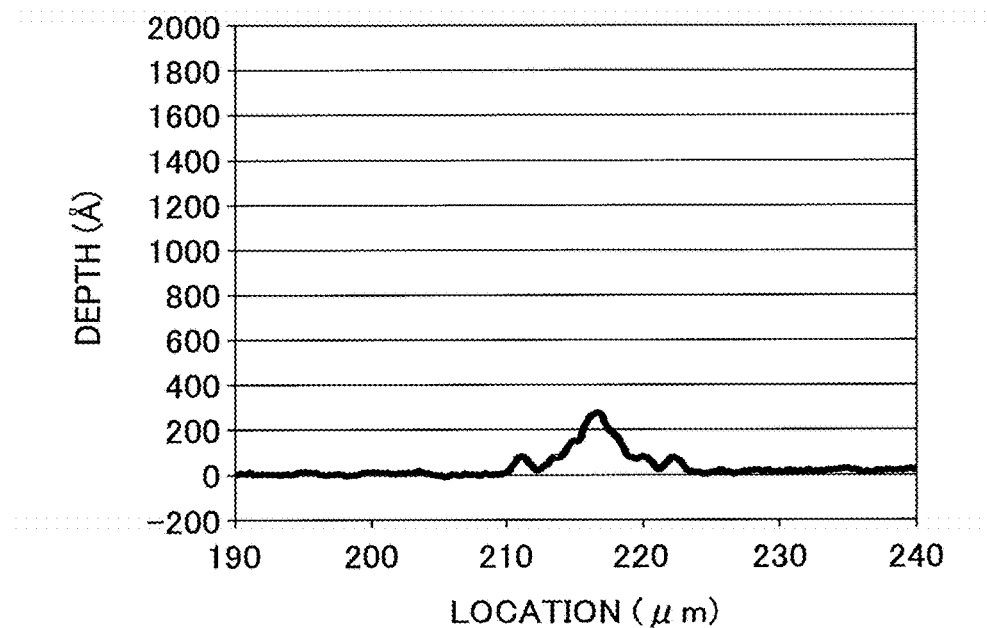
FIG. 7 is a diagram depicting an example of a result of measurement for a height level of the conductive film over the first region and the second region in the substrate with conductive film according to the Example 1.

FIG. 7 depicts an example of the results of measurement. In FIG. 7, the horizontal axis represents a relative position of the conductive film in the horizontal direction. The vertical axis represents a height level of the uppermost surface of the conductive film. In FIG. 7, data are displayed so that the second region is arranged approximately at the center of the drawing (position x falls within the range of 210 µm to 220 µm).

It was found that from the results of measurement, the second region tends to be raised, although only slightly. Because the second region did not become a recessed shape, it was found that, with the power of laser light selected in the example 1, an energy of an order of removing the second region by abrasion (i.e. the thickness becomes smaller) was not inputted.

Moreover, from the obtained results, the irradiated part was considered to be locally heated, by the irradiation of laser light, and thereby a local expansion in volume occurred in the conductive film. Furthermore, with the expansion in volume, numerous fine cracks were generated and thereby a fine structure part was formed.

The extent of raising of the second region was extremely small, i.e. about 200 Å at the maximum. The uppermost surface of the second region is considered to be approximately the same height level as the uppermost surface of the first region substantially.

(Evaluation of Electric Resistance)

Next, an electric resistance of the conductive film of the substrate with conductive film according to the example 1 was evaluated by the following method.

First, the conductive film of the substrate with conductive film according to the example 1 was cut within a predetermined range, and a sample for measuring electric resistance was obtained.

Figure 8:
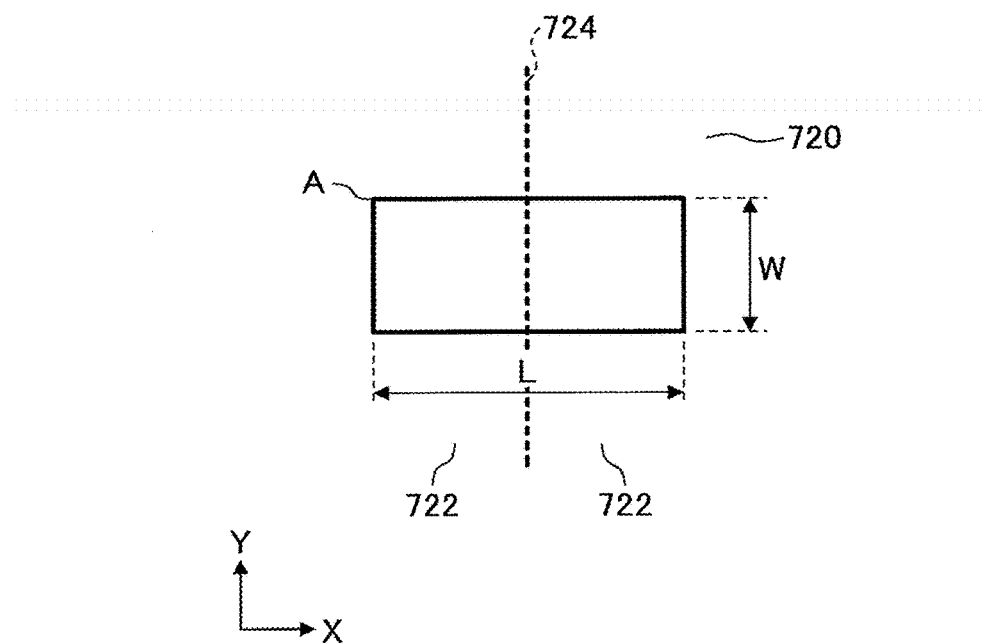
FIG. 8 is a diagram schematically depicting an aspect upon obtaining an electrical resistance measurement sample A from the conductive film in the substrate with conductive film according to the Example 1.

FIG. 8 schematically depicts an aspect for cutting the conductive film.

As illustrated in FIG. 8, the conductive film 720 includes a first region 722 and a second region 724. The electric resistance measurement sample A was cut into a size of length L=6 mm×width W=5 mm. The "length" of the electric resistance measurement sample A indicates a measure in the X-direction in FIG. 8, i.e. a measure in a direction orthogonal to the extension direction of the second region 724 of the conductive film 720. The "width" of the electric resistance measurement sample A indicates a measure in the Y-direction in FIG. 8, i.e. a measure in a direction parallel to the extension direction of the second region 724 of the conductive film 720. The electric resistance measurement sample A was extracted so as to include one second region 724 in the central portion of the length L.

By using the electric resistance measurement sample A, extracted as above, a line resistance Rs of the electric resistance measurement sample A was measured. For the measurement, a digital multimeter (CDM-17D: by CUSTOM Corporation) was used.

Next, by using a sample 1 manufactured by the above-described method (i.e. a second region is not formed on the conductive film), the same measurement was performed, and a line resistance Ro was measured. Moreover, from the following formula (1), a ratio of change of electric resistance P of the electric resistance measurement sample A was obtained:

Ratio of change of electric resistance $P=Rs/Ro$ (second region is not formed) (1)

As a result, the ratio of change P was 11.4. That is, the line resistance of the electric resistance measurement sample A increases 11.4 times compared with the electric resistance of the conductive film of the state before forming the second region.

The result suggests that the electric resistance of the second region increases significantly compared with the electric resistance of the first region, i.e. the second region becomes a high resistance region.

Next, by using an electric resistance measurement sample B extracted at another site of the conductive film, the same measurement was performed.

Figure 9:
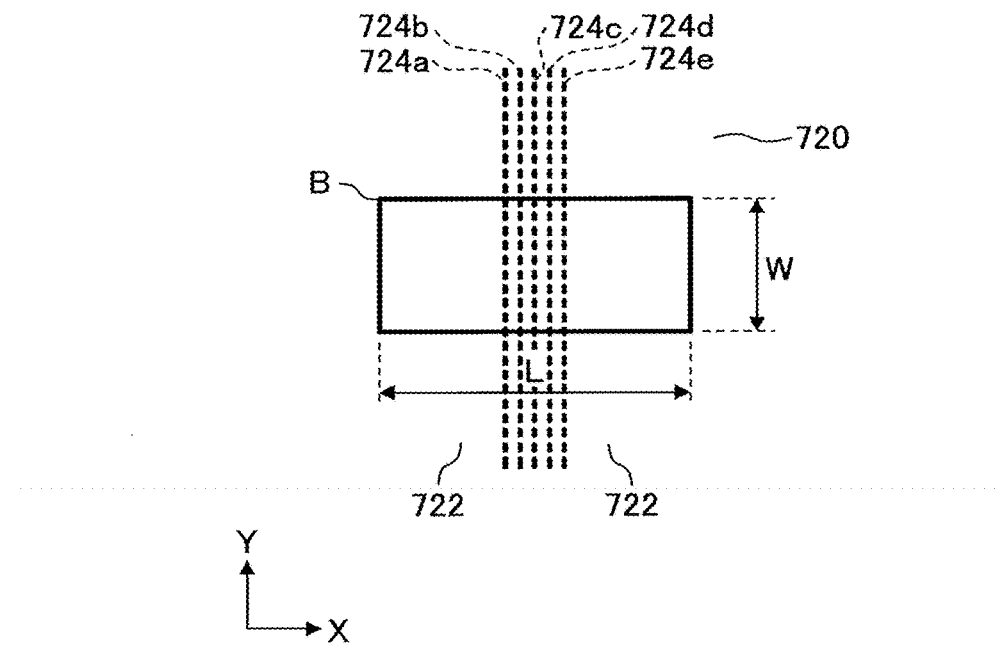
FIG. 9 is a diagram schematically depicting an aspect upon obtaining an electrical resistance measurement sample B from the conductive film in the substrate with conductive film according to the Example 1.

FIG. 9 schematically depicts an aspect upon extracting the electric resistance measurement sample B from the conductive film.

As illustrated in FIG. 9, the electric resistance measurement sample B was obtained by cutting into a size of Length of L=6 mm×Width of W=5 mm. However, the electric resistance measurement sample B was extracted so that five (in total) second regions 724a-724e were included in a central portion of the length L. In this mode, the respective second regions 724a-724e are arranged with a pitch of about 20 μm.

As a result of measurement, the rate of change P was 30. That is, the line resistance of the electric resistance measurement sample B increases 30 times compared with the electric resistance of the conductive film of the state before forming the second regions.

As described above, it was confirmed that in the substrate with conductive film according to the example 1, in the irradiated region a "fine structure part" was formed, the irradiated region became the second region, and the second region became a high resistance region.

(Free Electron Concentration)

Next, a free electron concentration of the conductive film of the substrate with conductive film according to the example 1 was evaluated by using a Hall effect measuring device by Accent Optical Technologies Co., Ltd. As a result, the free electron concentration of the conductive film of the substrate with conductive film according to the example 1 was $1.3 \times 10^{21}/cm^3$.

Example 2

A substrate with conductive film was prepared by using the following method.

First, for the base material, a transparent alkali-free glass substrate with a thickness of 0.7 mm was prepared.

Next, in a state where the glass substrate was heated at 300° C., an ITO layer was deposited on the glass substrate by a sputtering method. For a target, an ITO target containing $SnO_2$ of 10 wt % was used. A film thickness of the deposited ITO layer was 150 nm.

Next, a TTO layer was deposited on the ITO layer by a sputtering method. For a target, an $SnO_2$ target containing $Ta_2O_5$ of 5 wt % was used. A film thickness of the deposited TTO layer was 35 nm.

According to the above-described processes, a sample in which a conductive film of two-layered structure was arranged on the glass substrate (in the following, referred to as a "sample 2") was manufactured.

Next, a pattern of an irradiated region was formed on the conductive film of the sample 2, by the following method.

First, the sample 2 was arranged to be level such that the conductive film was in an upward direction.

Next, the conductive film of the sample 2 was irradiated with a laser light. For the laser light, a laser with a wavelength of 1064 nm was used. Moreover, a pulse energy of the laser light was set to 4 μJ.

The laser light scanned the conductive film linearly along a first direction. Next, an irradiation position of the laser light was shifted by 2 μm, and the laser light scanned along the first direction. The above-described operation was repeated a few times, and a linear-shaped irradiated region with a width of about 10 μm was formed. The same operation was repeated at other locations of the conductive film, and a plurality of linear-shaped irradiated regions were formed on the conductive film.

The substrate with conductive film obtained by the above-described processes will be referred to, in the following, as a "substrate with conductive film according to the example 2". In the substrate with conductive film according to the example 2, the skeleton-visible phenomenon was not observed.

(Evaluation)

Next, by using the substrate with conductive film according to the example 2, various evaluations were performed by using the same method as in the example 1.

(Observation of surface)

As a result of observation of the surface of the conductive film of the substrate with conductive film according to the example 2, it was found that in the irradiated region of the laser light of the conductive film a fine structure part exists. In the fine structure part, widths of fine cracks fall within a range of 1 nm to 50 nm in any locations. Moreover, largest measures $L_{max}$ of cellular sections fall within a range of 1 μm-7 μm.

In this way, it was confirmed that by irradiating with the laser light, in the irradiated region, a second region including the fine structure part was formed. That is, it was confirmed that in the conductive film of the substrate with conductive film according to the example 2, a pattern of repeating the first region (corresponding to a non-irradiated region of laser light) and the second region (corresponding to the irradiated region of laser light) was formed.

(Measurement of Surface Mode)

In the substrate with conductive film according to the example 2, a surface unevenness state of the second region of the conductive film was measured.

Figure 10:
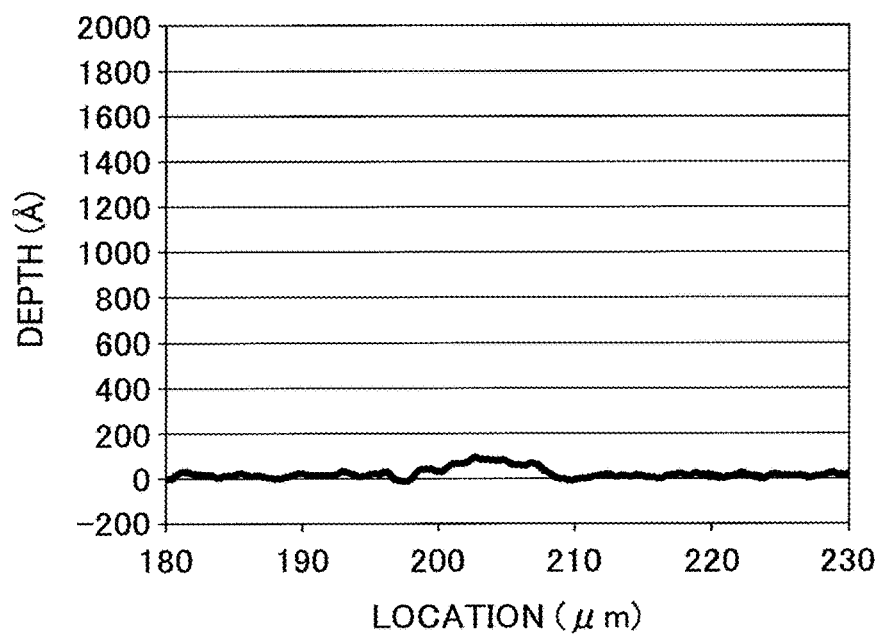
FIG. 10 is a diagram depicting an example of a result of measurement for a height level of the conductive film over the first region and the second region in the substrate with conductive film according to an Example 2.

FIG. 10 depicts an example of a result of the measurement. In FIG. 10, the horizontal axis represents a relative position of the conductive film in the horizontal direction. The vertical axis represents a height level of the uppermost surface of the conductive film. In FIG. 10, data are displayed so that the second region is arranged approximately at the center of the drawing (position x falls within the range of 200 μm to 210 μm).

It was found that from the results of measurement, the second region is not a recessed shape, substantially, and the uppermost surface of the second region is approximately the same height level as the uppermost surface of the first region.

(Evaluation of Electric Resistance)

An electric resistance of the conductive film of the substrate with conductive film according to the example 2 was evaluated by the same method as in the example 1.

As a result, the ratio of electric resistance P in the electric resistance measurement sample A obtained by the above-described formula (1) was 8.9. That is, the line resistance of the electric resistance measurement sample A increases 8.9 times compared with the electric resistance of the conductive film of the state before forming the second region.

Moreover, the ratio of electric resistance P in the electric resistance measurement sample B was 48.8.

(Free Electron Concentration)

Next, a free electron concentration of the conductive film of the substrate with conductive film according to the example 2 was evaluated. As a result, the free electron concentration of the conductive film of the substrate with conductive film according to the example 1 was $1.4 \times 10^{21}$/ cm$^3$.

The result suggests that the electric resistance in the second region increases significantly compared with the electric resistance of the first region, i.e. the second region becomes a high resistance region.

As described above, it was confirmed that in the substrate with conductive film according to the example 2, in the irradiated region a "fine structure part" was formed, the irradiated region became the second region, and the second region became a high resistance region.

Example 3

A substrate with conductive film was prepared by the following method.

First, for the base material, a transparent soda lime glass substrate with a thickness of 3.2 mm was prepared. On one surface of the glass substrate, an SiO$_2$ layer was previously arranged as a barrier layer. A thickness of the SiO$_2$ layer was about 20-30 nm.

Next, in a state where the glass substrate was heated at 300° C., an ITO layer was deposited on the glass substrate by a sputtering method. For a target, an ITO target containing SnO$_2$ of 10 wt % was used. A film thickness of the deposited ITO layer was 150 nm.

According to the above-described processes, a sample in which a conductive film of single-layered structure was arranged on the glass substrate with the SiO$_2$ layer (in the following, referred to as a "sample 3") was manufactured.

Next, on the conductive film of the sample 3, by the same method as in the example 1, a pattern of the second region was formed.

The substrate with conductive film obtained by the above-described processes will be referred to, in the following, as a "substrate with conductive film according to the example 3". In the substrate with conductive film according to the example 3, the skeleton-visible phenomenon was not observed.

By using the substrate with conductive film according to the example 3, the above-described various evaluations were performed.

As a result, it was confirmed that in the substrate with conductive film according to the example 3, in the irradiated region a "fine structure part" was formed, the irradiated region became the second region, and the second region became a high resistance region. Moreover, it was found that the second region was not a recessed shape, and substantially, the uppermost surface of the second region was approximately the same height level as the uppermost surface of the first region.

Example 4

A substrate with conductive film was prepared by using the following method.

First, for the base material, a transparent alkali-free glass substrate with a thickness of 0.7 mm was prepared.

Next, in a state where the glass substrate was heated at 300° C., an ITO layer was deposited on the glass substrate by a sputtering method. For a target, an ITO target containing SnO$_2$ of 10 wt % was used. A film thickness of the deposited ITO layer was 150 nm.

According to the above-described processes, a sample in which a conductive film of single-layered structure was arranged on the glass substrate (in the following, referred to as a "sample 4") was manufactured.

Next, on the conductive film of the sample 4, by the same method as in the example 2, a pattern of the second region was formed.

The substrate with conductive film obtained by the above-described processes will be referred to, in the following, as a "substrate with conductive film according to the example 4". In the substrate with conductive film according to the example 4, the skeleton-visible phenomenon was not observed.

By using the substrate with conductive film according to the example 4, the above-described various evaluations were performed.

As a result, it was confirmed that in the substrate with conductive film according to the example 4, in the irradiated region a "fine structure part" was formed, the irradiated region became the second region, and the second region became a high resistance region. Moreover, it was found that the second region was not a recessed shape, and substantially, the uppermost surface of the second region was approximately the same height level as the uppermost surface of the first region.

Example 5 and Example 6

A substrate with conductive film according to an example 5 was manufactured by the same method as in the example 1. However, in the example 5, the glass substrate was not heated, and an ITO layer was deposited at a room temperature.

A substrate with conductive film according to an example 6 was manufactured by the same method as in the example 2. However, in the example 6, the glass substrate was not heated, and an ITO layer was deposited at a room temperature.

The free electron concentration of the substrate with conductive film according to the example 5 was $4.8 \times 10^{21}/cm^3$. Moreover, the free electron concentration of the substrate with conductive film according to the example 6 was $4.5 \times 10^{21}/cm^3$.

In the example 5 and the example 6, fine cracks cannot be formed appropriately by the irradiation of a laser light, and a skeleton-visible phenomenon cannot be effectively prevented from occurring.

The present invention can be preferably applied to, for example, a display device, an electrochromic device, and the like.

What is claimed is:

1. A substrate with conductive film comprising:
   a base material; and
   a film of a conductive metal oxide arranged on an upper part of the base material,
   wherein the film includes, by a top plan view, a first region and a second region, the second region is configured of a same material as the first region, and an electric resistance of the second region is higher than an electric resistance of the first region,
   wherein the second region includes a part configured by a plurality of cellular sections surrounded by a plurality of fine cracks, and
   wherein in the part a local expansion in volume occurs in the conductive metal oxide forming random fine cracks, each fine crack has a width of 5 nm to 30 nm, and each cellular section has a largest measure of less than 10 μm.

2. The substrate with conductive film according to claim 1, wherein an uppermost surface of the first region and an uppermost surface of the second region are at a same height level.

3. The substrate with conductive film according to claim 1, wherein the film is a transparent film.

4. The substrate with conductive film according to claim 1, wherein the conductive metal oxide includes an oxide of at least one metal selected from a group including indium (In), tin (Sn), and zinc (Zn).

5. The substrate with conductive film according to claim 1, wherein the conductive metal oxide has a free electron concentration of greater than or equal to $5.0 \times 10^{20}/cm^3$.

6. The substrate with conductive film according to claim 1, wherein the film has a thickness that falls within a range of 10 nm to 300 nm.

7. The substrate with conductive film according to claim 1, wherein the base material is a transparent base material.

8. The substrate with conductive film according to claim 1, wherein the base material is a glass.

9. The substrate with conductive film according to claim 1, wherein the film is a laminated film of two or more layers.

10. The substrate with conductive film according to claim 1, wherein the second region is arranged as a linear-shaped pattern, a lattice-shaped pattern, or a dot-shaped pattern.

11. The substrate with conductive film according to claim 1, wherein the largest measure of a cellular section ranges from 1 μm to 7 μm.

12. The substrate with conductive film according to claim 1, wherein in a part where the film of a conductive metal oxide is formed, regions having appreciably different refractive indices are not present.

13. The substrate with conductive film according to claim 1, wherein an uppermost surface of the second region in said film is raised relative to an uppermost surface of the first region.

14. The substrate with conductive film according to claim 13, wherein the extent of raising is at most 200 Å.

15. The substrate with conductive film according to claim 1, wherein the height of an uppermost surface of the second region is within a range of ±20% with respect to the height of an uppermost surface of the first region in said film.

* * * * *